United States Patent
Lee

(10) Patent No.: US 9,040,971 B2
(45) Date of Patent: May 26, 2015

(54) THIN FILM TRANSISTOR AND ORGANIC LIGHT EMITTING PIXEL HAVING THE SAME

(71) Applicant: Samsung Display Co., Ltd., Yongin, Gyeonggi-Do (KR)

(72) Inventor: Yong Soo Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 59 days.

(21) Appl. No.: 14/035,317

(22) Filed: Sep. 24, 2013

(65) Prior Publication Data

US 2014/0131678 A1    May 15, 2014

(30) Foreign Application Priority Data

Nov. 14, 2012    (KR) .................. 10-2012-0129030

(51) Int. Cl.
| | |
|---|---|
| *H01L 29/08* | (2006.01) |
| *H01L 35/24* | (2006.01) |
| *H01L 51/00* | (2006.01) |
| *H01L 29/786* | (2006.01) |
| *H01L 27/12* | (2006.01) |

(52) U.S. Cl.
CPC .... *H01L 29/78696* (2013.01); *H01L 29/78615* (2013.01); *H01L 27/124* (2013.01); *H01L 27/1255* (2013.01)

(58) Field of Classification Search
CPC ............... H01L 29/78696; H01L 29/78618; H01L 29/78621; H01L 29/78624; H01L 29/41733

USPC .............. 257/40, 59, 72, 314, 316, 318, 322, 257/344, 408, E29.117, E51.018; 313/483, 313/500, 504, 509; 327/567; 345/39, 46, 345/82, 204–206, 694; 349/38, 39, 51, 52; 438/149, 151, FOR. 201, FOR. 184
See application file for complete search history.

(56) References Cited

U.S. PATENT DOCUMENTS

| | | | |
|---|---|---|---|
| 2001/0030323 A1* | 10/2001 | Ikeda | ............................... 257/59 |
| 2006/0214229 A1 | 9/2006 | Toyoda et al. | |
| 2010/0006855 A1 | 1/2010 | Park et al. | |

FOREIGN PATENT DOCUMENTS

| | | |
|---|---|---|
| JP | 2006-269808 A | 10/2006 |
| KR | 10-0543011 B1 | 1/2006 |
| KR | 10-2010-0007609 A | 1/2010 |

* cited by examiner

*Primary Examiner* — Meiya Li
*Assistant Examiner* — Peter M Albrecht
(74) *Attorney, Agent, or Firm* — Knobbe Martens Olson & Bear LLP

(57) ABSTRACT

A thin film transistor (TFT) that includes a control electrode, a semiconductor pattern, a first input electrode, a second input electrode, and an output electrode is disclosed. in one aspect, the semiconductor pattern includes a first input area, a second input area, a channel area, and an output area. The channel area is formed between the first input area and the output area and overlapped with the control electrode to be insulated from the control electrode. The second input area is formed between the first input area and the channel area and doped with a doping concentration different from a doping concentration of the first input areas. The second input electrode makes contact with the second input area and receives a control voltage to control a threshold voltage.

19 Claims, 8 Drawing Sheets

THIN FILM TRANSISTOR AND ORGANIC LIGHT EMITTING PIXEL HAVING THE SAME

CROSS-REFERENCE TO RELATED APPLICATIONS

This U.S. non-provisional patent application claims priority under 35 U.S.C. §119 of Korean Patent Application No. 10-2012-0129030, filed on Nov. 14, 2012, the contents of which are hereby incorporated by reference.

BACKGROUND

1. Field

The disclosed technology relates to a thin film transistor (TFT) and an organic light emitting pixel that uses the TFT.

2. Description of the Related Technology

An organic light emitting display panel includes a plurality of organic light emitting pixels. Each pixel includes at least one thin film transistor, a capacitor, and an organic light emitting diode (OLED). The thin film transistor includes a control electrode (also known as a gate electrode), a semiconductor pattern, an input electrode (also known as a source electrode), and an output electrode (also known as a drain electrode).

When a voltage higher than a threshold voltage is applied to the control electrode, the thin film transistor is turned on. The turned-on thin film transistor outputs a voltage through the output electrode, which corresponds to a voltage applied to the input electrode.

SUMMARY OF CERTAIN INVENTIVE ASPECTS

A thin film transistor capable of controlling a threshold voltage thereof is disclosed as well as an organic light emitting pixel that uses such TFT.

An aspect of the inventive concept includes a thin film transistor comprising: a control electrode, a semiconductor pattern, a first input area, a second input electrode, and an output electrode. The semiconductor pattern includes a first input area, a second input area, a channel area, and an output area. The channel area is formed between the first input area and the output area and overlapped with the control electrode to be insulated from the control electrode. The second input area is formed between the first input area and the channel area and doped with a doping concentration different from a doping concentration of the first input areas. The second input electrode making contact with the second input area and receives a control voltage to control a threshold voltage and an output electrode making contact with the output area.

In various embodiments, the doping concentration of the second input area is in a range from about 1/10 to 1/500 of the doping concentration of the first input area. The first input area, the second input area, and the output area are doped with the same type of dopant. The first input area, the second input area, and the output area are doped with a p-type dopant, the channel is an n-type, the threshold voltage is increased when the control voltage is negative, and the threshold voltage is decreased when the control voltage is positive.

The thin film transistor further comprising a first insulating layer formed between the control electrode and the semiconductor pattern. In addition, the thin film transistor further comprising a second insulating layer formed on the first insulating layer. The control electrode is formed on the first insulating layer that covers the semiconductor pattern. The first input electrode, the second input electrode, and the output electrode are formed on the second insulating layer that covers the control electrode.

The first input electrode is connected to the first input area through a first contact hole formed through the first insulating layer and the second insulating layer, the second input electrode is connected to the second input area through a second contact hole formed through the first insulating layer and the second insulating layer, and the output electrode is connected to the output area through a third contact hole formed through the first insulating layer and the second insulating layer.

The semiconductor pattern is formed on the first insulating layer that covers the control electrode, the first input electrode makes contact with the first input area, the second input electrode makes contact with the second input areas, and the output electrode makes contact with the output area.

Another aspect of the inventive concept includes an organic light emitting pixel, comprising: an organic light emitting diode, a first thin film transistor, a second thin film transistor, and a capacitor. At least one of the first and second thin film transistors is the above-mentioned thin film transistor.

In various embodiments, the first thin film transistor outputs a pixel voltage in response to a gate voltage, and the second thin film transistor is connected to the first thin film transistor, and the organic light emitting diode and that is turned on in response to the pixel voltage to control a driving current flowing through the organic light emitting device.

The capacitor is connected to the first thin film transistor and the second thin film transistor to control a turn-on period of the second thin film transistor at least one of the first and second thin film transistors comprising: a control electrode, a semiconductor pattern that includes a first input area, an output area, a channel area formed between the first input area and the output area and overlapped with the control electrode to be insulated from the control electrode, and a second input area formed between the first input area and the channel area and doped with a doping concentration different from a doping concentration of the first input area, a first input electrode making contact with the first input area, a second input electrode making contact with the second input area and receiving a control voltage to control a threshold voltage and an output electrode making contact with the output area.

The control electrode of the first thin film transistor receives the gate voltage and the first input electrode of the first thin film transistor receives a data voltage corresponding to the pixel voltage.

The first input electrode of the second thin film transistor receives a power source voltage to drive the organic light emitting diode.

In various embodiments, the threshold voltage of the thin film transistor is changed depending on the voltage applied to the second input electrode. When the negative voltage is applied to the second input electrode, the source-drain current is decreased with respect to uniform gate voltage. When the positive voltage is applied to the second input electrode, the source-drain current is increased with respect to the uniform gate voltage.

Although the gate voltage having the level lower or higher than a reference level is applied to the thin film transistor, the organic light emitting pixel is normally driven. The threshold voltage of the thin film transistor may be controlled to allow the thin film transistor to be turned on in response to the gate voltage with the different level from the reference level.

BRIEF DESCRIPTION OF THE DRAWINGS

The above and other advantages of the disclosed technology will become readily apparent by reference to the following detailed description when considered in conjunction with the accompanying drawings wherein.

DETAILED DESCRIPTION OF CERTAIN INVENTIVE EMBODIMENTS

Figure 1:
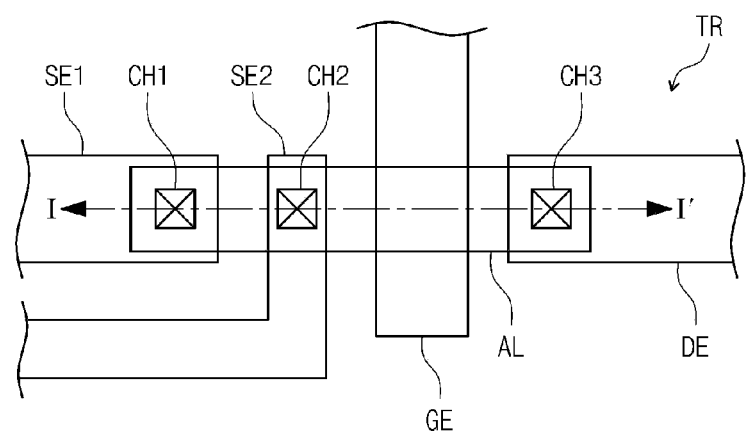
FIG. 1 is a plan view showing a thin film transistor according to an exemplary embodiment of the disclosed technology.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosed technology.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the disclosed technology disclosed technology will be explained in detail with reference to the accompanying drawings.

Figure 2:
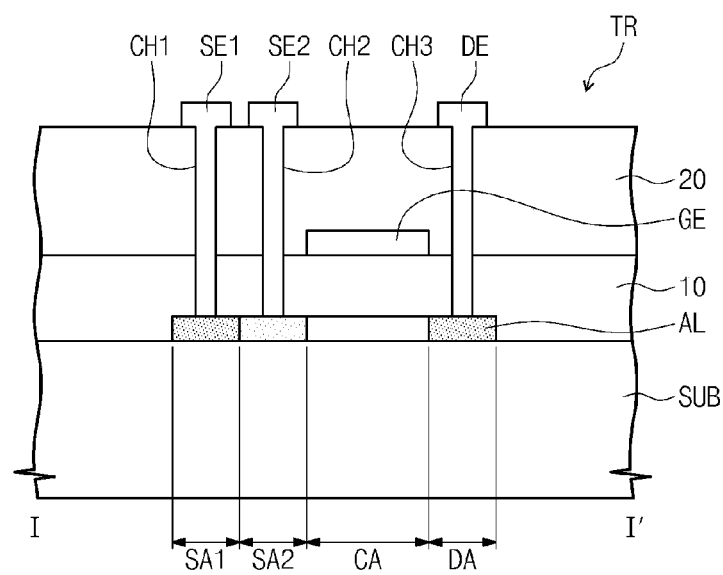
FIG. 2 is a cross-sectional view taken along a line I-I' of FIG. 1.

FIG. 1 is a plan view showing a thin film transistor according to an exemplary embodiment of the disclosed technology and FIG. 2 is a cross-sectional view taken along a line I-I' of FIG. 1.

Referring to FIGS. 1 and 2, the thin film transistor TR includes a control electrode GE, a first input electrode SE1, a second input electrode SE2, a semiconductor pattern AL, and an output electrode DE.

In an exemplary embodiment, a p-channel MOS thin film transistor will be described as the thin film transistor TR. The control electrode GE will be referred to as a gate electrode, and the first and second input electrodes SE1 and SE2 will be respectively referred to as first and second source electrodes. In addition, the output electrode DE will be referred to as a drain electrode. According to embodiments, the thin film transistor TR may be an n-channel MOS thin film transistor.

The semiconductor pattern AL is formed on a base substrate SUB. The gate electrode GE is formed on the semiconductor pattern AL. The thin film transistor TR has a top-gate structure.

The semiconductor pattern AL includes a first input area SA1, a second input area SA2, a channel area CA, and an output area DA. In at least one embodiment, the first input area SA1, the second input area SA2, and the output area DA will be described as a first source area, a second source area, and a drain area, respectively.

The first source area SA1, the second source area SA2, the channel area CA, and the drain area DA are successively arranged. The first source area SA1, the second source area SA2, and the drain area DA are doped with a p-type dopant. The second source area SA2 is doped at a lower concentration than that of the first source area SA1. For instance, a doping concentration of the second source area SA2 is in a range from 1/10 to 1/500 of the doping concentration of the first source area SA1. The channel area CA is configured to include an n-type semiconductor or a p-type semiconductor in accordance with a doping material. The channel area CA may be an intrinsic semiconductor.

A first insulating layer 10 is formed on the base substrate SUB to cover the semiconductor pattern AL. The first insulating layer 10 may include an inorganic material, e.g., silicon oxide (SiOx), silicon nitride (SiNx), etc. The first insulating layer 10 has a multi-thin-layer structure.

The gate electrode GE is formed on the first insulating layer 10. The gate electrode GE is overlapped with the channel area CA. As shown in FIG. 1, the gate electrode GE may cross the semiconductor pattern AL on the channel area CA.

A second insulating layer 20 is formed on the first insulating layer 10 to cover the gate electrode GE. The second insulating layer 20 may include an inorganic material, e.g., silicon oxide (SiOx), silicon nitride (SiNx), etc. The second insulating layer 20 has a multi-thin-layer structure.

The first source electrode SE1, the second source electrode SE2, and the drain electrode DE are formed on the second insulating layer 20. The first source electrode SE1 is connected to the first source area SA1 through a first contact hole CH1 formed penetrating through the first and second insulating layers 10 and 20. The second source electrode SE2 is connected to the second source area SA2 through a second contact hole CH2 formed penetrating through the first and second insulating layers 10 and 20. The drain electrode DE is connected to the drain area DA through a third contact hole CH3 formed penetrating through the first and second insulating layers 10 and 20. According to various embodiments, the first source electrode SE1, the second source electrode SE2, and the drain electrode DE may be formed on the first insulating layer 10.

When a voltage (hereinafter, referred to as a gate voltage) is applied to the gate electrode GE, a channel is formed and a current flows between the first source electrode SE1 and the drain electrode DE through the channel. A threshold voltage is the gate voltage at a time point at which the current starts to flow between the first source electrode SE1 and the drain electrode DE.

The second source electrode SE2 receives a control voltage to control the threshold voltage. The control voltage is a bias voltage. According to a polarity and a level of the control voltage, the current may flow at a low gate voltage through the channel and may not flow at a high gate voltage through the channel.

Figure 3A:
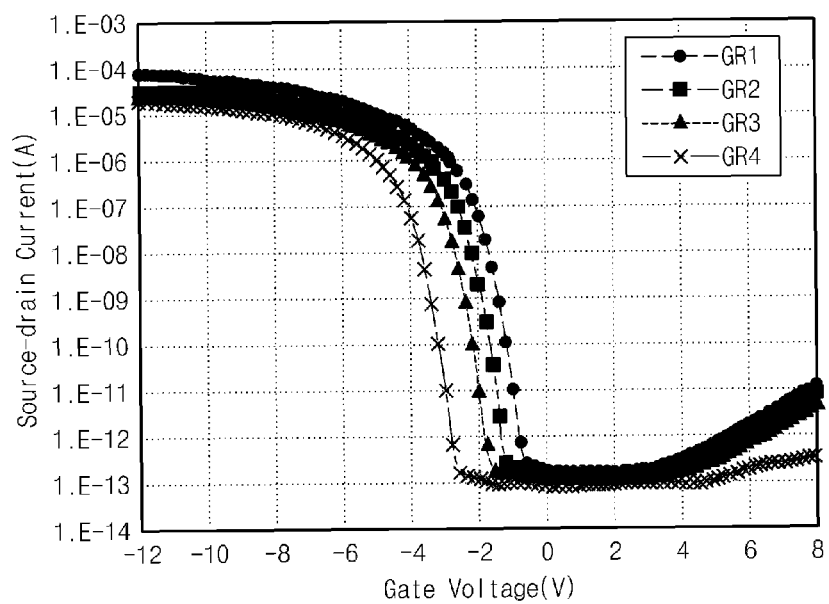
FIGS. 3A and 3B are graphs showing a source-drain current versus a gate voltage.
Figure 3B:
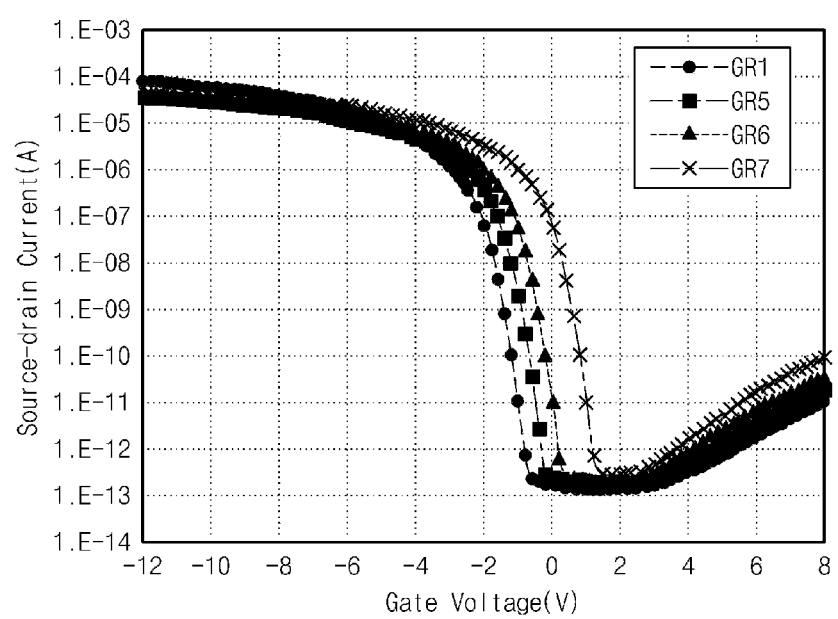

FIGS. 3A and 3B are graphs showing a source-drain current versus a gate voltage. FIG. 3A shows the source-drain current of the thin film transistor when a negative control voltage is applied to the second source electrode, and FIG. 3B shows the source-drain current of the thin film transistor when a positive control voltage is applied to the second source electrode.

A first graph GR1 shown in FIGS. 3A and 3B represents the source-drain current of the thin film transistor when the control voltage is not applied to the second source electrode. In FIG. 3A, second, third, and fourth graphs GR2, GR3, and GR4 represent the source-drain current when the control voltage is about −0.5 volts, −1 volts, and −2 volts, respectively. The second, third, and fourth graphs GR2, GR3, and GR4 are shifted to a left side as compared to the first graph G1. Consequently, the source-drain current of the thin film transistor applied with uniform gate voltage is decreased as the level of the negative control voltage becomes high.

In FIG. 3B, fifth, sixth, and seventh graphs GR5, GR6, and GR7 represent the source-drain current when the control voltage is about +0.5 volts, +1 volts, and +2 volts, respectively. The fifth, sixth, and seventh graphs GR5, GR6, and GR7 are shifted to a right side as compared to the first graph G1. Consequently, the source-drain current of the thin film transistor, that is applied with uniform gate voltage, is increased as the level of the positive control voltage becomes high.

This is because the threshold voltage becomes high when the control voltage is negative and the threshold voltage becomes low when the control voltage is positive. As described above, the thin film transistor controls the source-drain current by controlling the control voltage.

Figure 4:
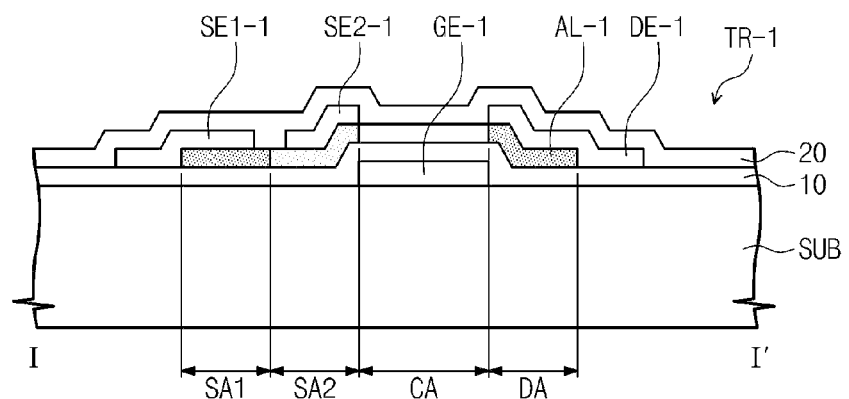
FIG. 4 is a cross-sectional view showing a thin film transistor according to an exemplary embodiment of the disclosed technology.

FIG. 4 is a cross-sectional view showing a thin film transistor according to an exemplary embodiment of the disclosed technology. In FIG. 4, the same reference numerals denote the same elements in FIGS. 1 to 3B, and thus detailed descriptions of the same elements will be omitted.

Referring to FIG. 4, a thin film transistor TR-1 has a bottom-gate structure. A gate electrode GE-1 is formed on the base substrate SUB. A first insulating layer 10 is formed on the base substrate SUB to cover the gate electrode GE-1.

A semiconductor pattern AL-1 is formed on the first insulating layer 10. The semiconductor pattern AL-1 includes a first source area SA1, a second source area SA2, a channel area CA, and a drain area DA, which are successively arranged. The channel area CA is overlapped with the gate electrode GE.

A first source electrode SE1-1, a second source electrode SE2-1, and a drain electrode DE-1 are formed on the first insulating layer 10. At least a portion of the first source electrode SE1-1 is formed in the first source area SA1 of the semiconductor pattern AL-1. At least a portion of the second source electrode SE2-1 is formed in the second source area SA2 of the semiconductor pattern AL-1. At least a portion of the drain electrode DE-1 is formed in the drain area DA of the semiconductor pattern AL-1.

A second insulating layer 20 is formed on the first insulating layer 10 to cover the exposed portion of the first source electrode SE-1, the second source electrode SE2-1, the drain electrode DE-1, and the semiconductor pattern AL-1.

According to various embodiments, another insulating layer may be formed between the semiconductor pattern AL-1 and each of the first source electrode SE1-1, the second source electrode SE2-1, and the drain electrode DE-1. In this case, the first source electrode SE1-1, the second source electrode SE2-1, and the drain electrode DE-1 make respective contact with the first source area SA1, the second source area SA2, and the drain area DA through contact holes formed penetrating through another insulating layer.

Embodiments of the disclosed thin film transistors, e.g., those described with reference to FIGS. 1 to 4, may be used in pixels included in various display panels. For instance, the thin film transistors may be applied to the pixels of a liquid crystal display panel, an electrophoretic display panel, an electrowetting display panel, or an organic light emitting display panel. Hereinafter, the organic light emitting display panel will be described in detail as a representative example.

Figure 5:
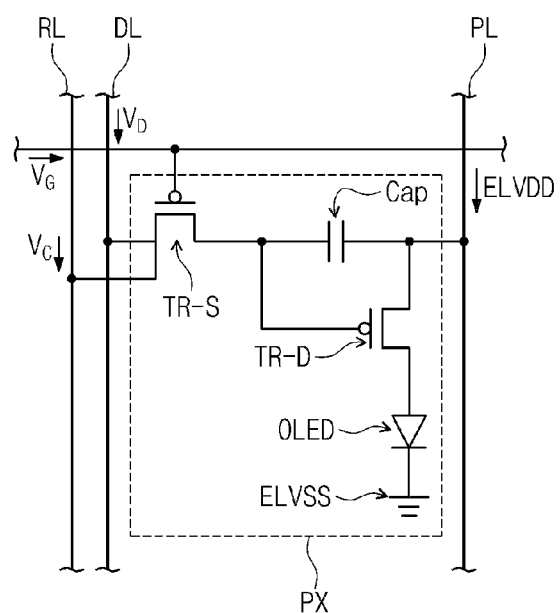
FIG. 5 is a circuit diagram showing an organic light emitting pixel according to an exemplary embodiment of the disclosed technology.
Figure 6:
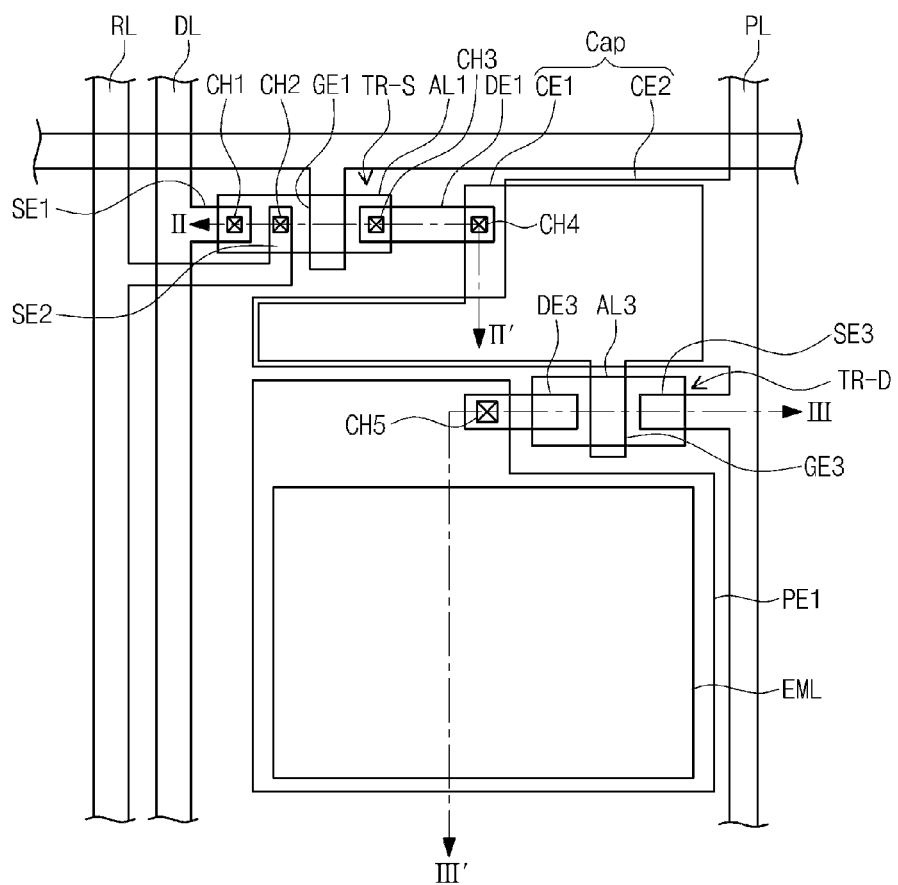
FIG. 6 is a plan view showing the organic light emitting pixel shown in FIG. 5.
Figure 7:
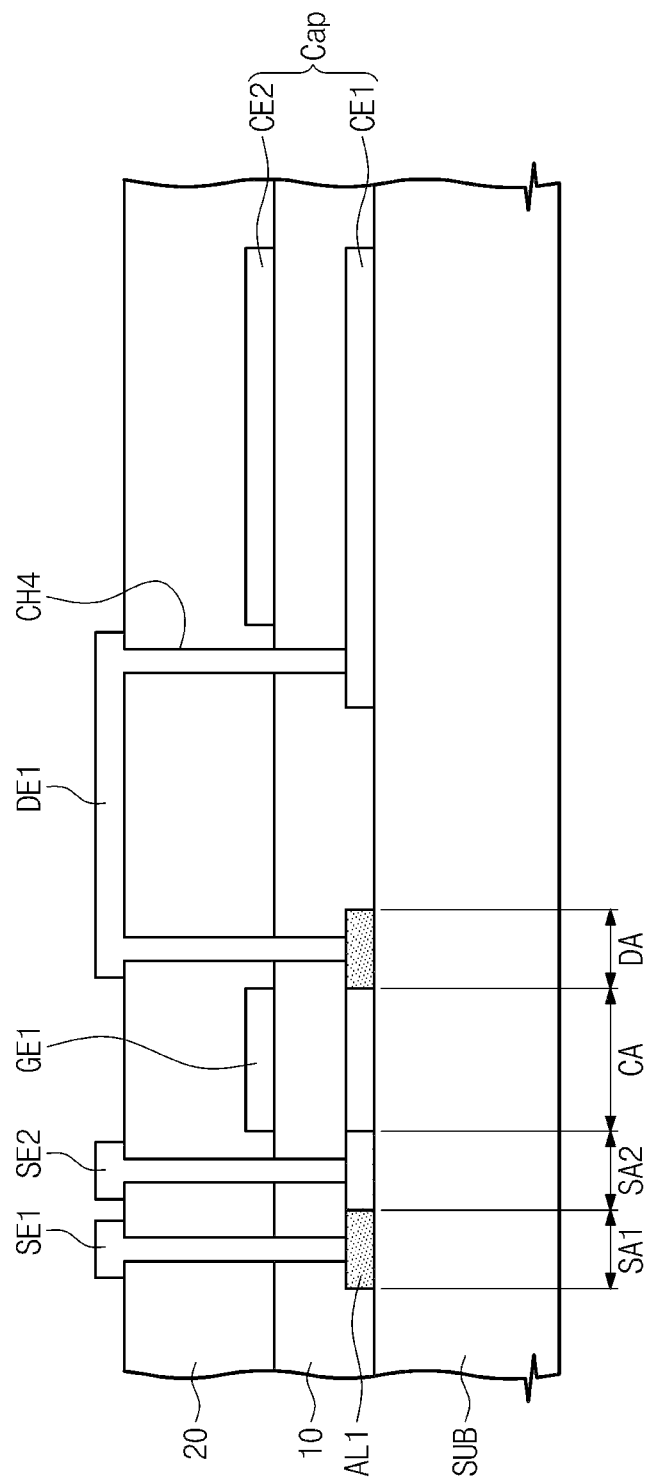
FIG. 7 is a cross-sectional view taken along a line II-II' of FIG. 6.
Figure 8:
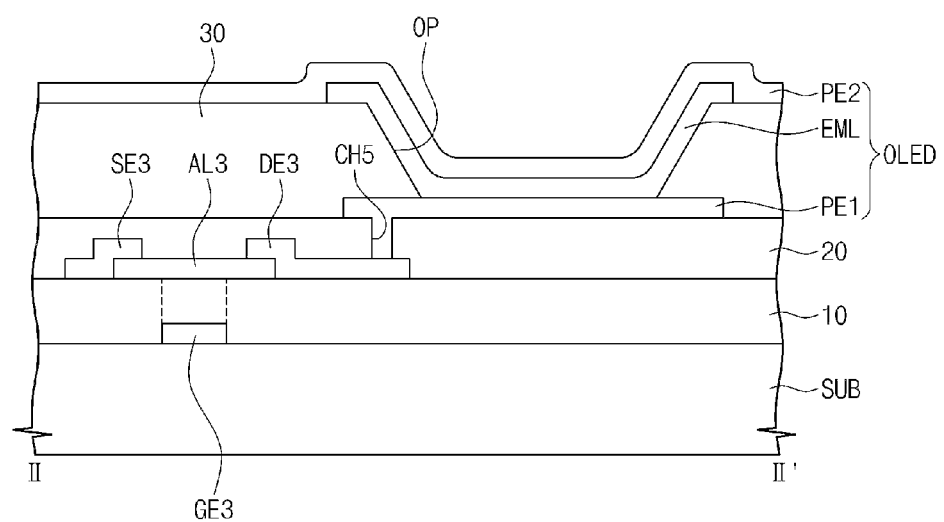
FIG. 8 is a cross-sectional view taken along a line III-III' of FIG. 6.

FIG. 5 is a circuit diagram showing an organic light emitting pixel according to an exemplary embodiment of the disclosed technology, FIG. 6 is a plan view showing the organic light emitting pixel shown in FIG. 5, FIG. 7 is a cross-sectional view taken along a line II-II' of FIG. 6, and FIG. 8 is a cross-sectional view taken along a line III-III' of FIG. 6.

The organic light emitting display panel includes a plurality of pixels PX arranged in a matrix form. The organic light emitting display panel includes a plurality of lines to apply signals to the pixels PX.

Hereinafter, only one pixel PX will be described in detail with reference to FIGS. 5 to 8.

Referring to FIG. 5, the pixel PX includes a first thin film transistor TR-S (hereinafter, referred to as a switching transistor), a second thin film transistor TR-D (hereinafter, referred to as a driving transistor), a capacitor Cap, and an organic light emitting diode OLED.

The switching transistor TR-S is connected to a gate line GL applied with a gate voltage $V_G$ and a data line DL applied with a data voltage $V_D$. The switching transistor TR-S outputs a pixel voltage corresponding to the data voltage $V_D$ in response to the gate voltage $V_G$.

The capacitor Cap is connected between the switching transistor TR-S and a driving line PL. The capacitor Cap is charged with electric charges corresponding to a difference between the pixel voltage and a first power source voltage ELVDD. The capacitor Cap maintains the turned-on state of the driving transistor TR-D for a predetermined time period.

The driving transistor TR-D is connected to the switching transistor TR-S, the capacitor Cap, and the driving line PL. The driving transistor TR-D is turned on in response to the pixel voltage. The driving transistor TR-D provides a driving current to the organic light emitting diode OLED.

The organic light emitting diode OLED generates light corresponding to the amount of the current provided from the driving transistor TR-D. A first electrode of the organic light emitting diode OLED receives a voltage, which corresponds to the first power source voltage ELVDD, from the driving transistor TR-D and a second electrode of the organic light emitting diode OLED receives a second power source voltage ELVSS having a level lower than that of the first power source voltage ELVDD. Here, the description of "the first electrode of the organic light emitting diode OLED receives the voltage corresponding to the first power source voltage ELVDD" means that the first power source voltage ELVDD applied to the input electrode of the driving transistor TR-D could be minutely different from the voltage output from the output electrode of the driving transistor TR-D.

Referring to FIGS. 6 and 7, the switching transistor TR-S includes a gate electrode GE1 (hereinafter, referred to as a first gate electrode), a semiconductor pattern AL1 (hereinafter, referred to a first semiconductor pattern), a first source electrode SE1, a second source electrode SE2, and a drain electrode DE1 (hereinafter, referred to as a first drain electrode). The switching transistor TR-S has the same structure as that of the thin film transistor described with reference to FIGS. 1 and 2.

Although the gate voltage $V_G$ applied to the switching transistor TR-S has the low level, the switching transistor TR-S is turned on since the positive control voltage $V_C$ is applied to the second source electrode SE2. This is because the threshold voltage of the switching transistor TR-S is decreased. On the contrary, although the gate voltage $V_G$ applied to the switching transistor TR-S has a high level, the switching transistor TR-S is turned off when the negative control voltage $V_C$ is applied to the second source electrode SE2. As described above, the on/off of the switching transistor TR-S may be controlled by the control voltage $V_C$.

The first semiconductor pattern AL1 and a first electrode CE1 of the capacitor Cap are formed on the base substrate SUB. A first insulating layer 10 is formed on the base substrate SUB. The first gate electrode GE1 branched from the gate line GL and a second electrode CE2 of the capacitor Cap are formed on the second electrode CE2. The second electrode CE2 of the capacitor Cap is connected to the driving line PL.

A second insulating layer 20 is formed on the first insulating layer 10. The first source electrode SE1, the second source electrode SE2, and the drain electrode DE1 are formed on the second insulating layer 20. The first source electrode SE1, the second source electrode SE2, and the first drain electrode DE1 are respectively connected to a first source area SA1, a second source area SA2, and a drain area DA of the first semiconductor pattern AL1 through first, second, and third contact holes CH1, CH2, and CH3 formed penetrating through the first and second insulating layers 10 and 20. In addition, the first drain electrode DE1 is connected to the first electrode CE1 of the capacitor Cap through a fourth contact hole CH4 formed through the second insulating layer 20.

Referring to FIGS. 6 and 8, the driving transistor TR-D includes a gate electrode GE3 (hereinafter, referred to as a third gate electrode), a semiconductor pattern AL3 (hereinafter, referred to as a third semiconductor pattern), a source electrode SE3 (hereinafter, referred to as a third source electrode), and a drain electrode DE3 (hereinafter, referred to as a third drain electrode). The driving transistor TR-D has the bottom-gate structure.

The third gate electrode GE3 is formed on the base substrate SUB. The third gate electrode GE3 is connected to the first electrode CE1 of the capacitor Cap. The third semiconductor pattern AL3 is formed on the first insulating layer 10. The third source electrode SE3 and the third drain electrode DE3 are formed on the first insulating layer 10. A portion of each of the third source electrode SE3 and the third drain electrode DE3 is overlapped with the semiconductor pattern AL3. The third source electrode SE3 is branched from the driving line PL.

The organic light emitting diode OLED electrically connected to the driving transistor TR-D is formed on the second insulating layer 20. The organic light emitting diode OLED includes a first electrode PE1, an organic light emission layer EML, and a second electrode PE2. In at least one embodiment, the first electrode PE1 serves as an anode and the second electrode PE2 serves as a cathode.

The first electrode PE1 is connected to the third drain electrode DE3 through a fifth contact hole CH5 formed through the second insulating layer 20. A third insulating layer 30 is formed on the second insulating layer 20. The third insulating layer 30 is provided with an opening portion OP formed therethrough to expose at least a portion of the first electrode PE1.

The organic light emission layer EML is formed on an inner wall of the opening portion OP to make contact with the first electrode PE1. The second electrode PE2 makes contact with the organic light emission layer EML and is formed on the third insulating layer 30. Although not shown in figures, hole injection and transport layers may be further formed between the first electrode PE1 and the organic light emission layer EML, and electron injection and transport layers may be further formed between the organic light emission layer EML and the second electrode PE2.

Figure 9:
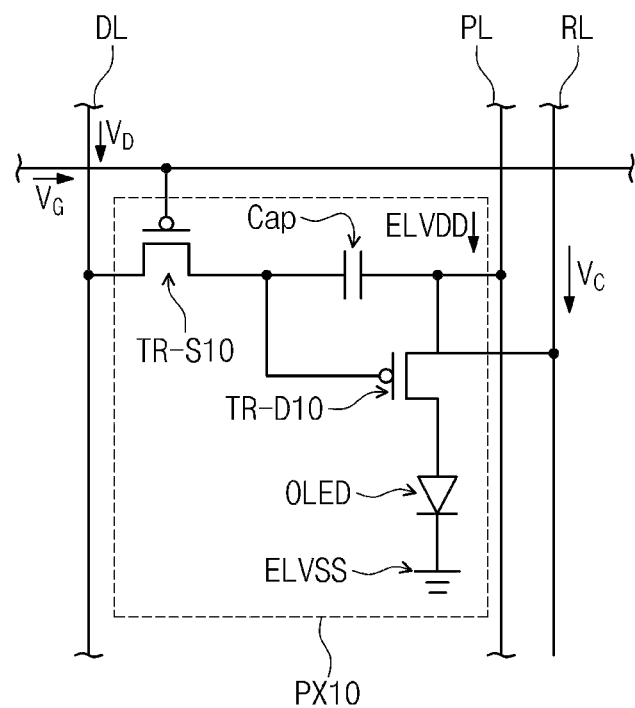
FIG. 9 is a circuit diagram showing an organic light emitting pixel according to an exemplary embodiment of the disclosed technology.

FIG. 9 is a circuit diagram showing an organic light emitting pixel according to an exemplary embodiment of the disclosed technology. In FIG. 9, detailed descriptions of same elements as those of the pixel described with reference to FIG. 8 will be omitted.

Referring to FIG. 9, a pixel PX10 includes a switching transistor TR-S10, a driving transistor TR-D10, a capacitor Cap, and an organic light emitting diode OLED. The driving transistor TR-D10 has the same structure as that of the thin film transistor described with reference to FIGS. 1 and 2.

In at least one embodiment, the switching transistor TR-S10 includes one source electrode, but it should not be limited thereto or thereby. That is, according to embodiment, the switching transistor TR-S10 may have the same structure as that of the thin film transistor described with reference to FIGS. 1 and 2.

Although a voltage applied to a gate electrode of the driving transistor TR-D10 has the low level, the driving transistor TR-D10 is turned on since the positive control voltage $V_C$ is applied to the second source electrode SE2. On the contrary, although the voltage applied to the gate electrode of the driving transistor TR-D10 has the high level, the driving transistor TR-D10 is turned off when the negative control voltage $V_C$ is applied to the second source electrode SE2 of the driving transistor TR-D10.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A thin film transistor, comprising:
a control electrode;
a semiconductor pattern that includes a first input area, an output area, a channel area formed between the first input area and the output area and overlapped with the control electrode to be insulated from the control electrode, and a second input area formed between and abutting the first input area and the channel area and doped with a doping concentration different from a doping concentration of the first input area;
a first input electrode making direct contact with the first input area;
a second input electrode making direct contact with the second input area and receiving a control voltage to control a threshold voltage; and
an output electrode making direct contact with the output area.

2. The thin film transistor of claim 1, wherein the doping concentration of the second input area is in a range from about $1/10$ to $1/500$ of the doping concentration of the first input area.

3. The thin film transistor of claim 2, wherein the first input area, the second input area, and the output area are doped with the same type of dopant.

4. The thin film transistor of claim 3, wherein the first input area, the second input area, and the output area are doped with a p-type dopant, the channel area is doped with an n-type dopant, the threshold voltage is increased when the control voltage is negative, and the threshold voltage is decreased when the control voltage is positive.

5. The thin film transistor of claim 1, further comprising a first insulating layer formed between the control electrode and the semiconductor pattern.

6. The thin film transistor of claim 5, further comprising a second insulating layer formed on the first insulating layer, wherein the control electrode is formed on the first insulating layer, the first insulating layer covers the semiconductor pattern, and wherein the first input electrode, the second input electrode, and the output electrode are formed on the second insulating layer, and the second insulating layer covers the control electrode.

7. The thin film transistor of claim 6, wherein the first input electrode is connected to the first input area through a first contact hole formed through the first insulating layer and the second insulating layer, the second input electrode is connected to the second input area through a second contact hole formed through the first insulating layer and the second insulating layer, and the output electrode is connected to the output area through a third contact hole formed through the first insulating layer and the second insulating layer.

8. The thin film transistor of claim 5, wherein the semiconductor pattern is formed on the first insulating layer, and the first insulating layer covers the control electrode.

9. An organic light emitting pixel, comprising:
an organic light emitting diode;
a first thin film transistor that outputs a pixel voltage in response to a gate voltage;
a second thin film transistor connected to the first thin film transistor and the organic light emitting diode and that is turned on in response to the pixel voltage to control a driving current flowing through the organic light emitting diode; and
a capacitor connected to the first thin film transistor and the second thin film transistor to control a turn-on period of the second thin film transistor, at least one of the first thin film transistor and the second thin film transistor comprising:
a control electrode;
a semiconductor pattern that includes a first input area, an output area, a channel area formed between the first input area and the output area and overlapped with the control electrode to be insulated from the control electrode, and a second input area formed between and abutting the first input area and the channel area and doped with a doping concentration different from a doping concentration of the first input area;
a first input electrode making direct contact with the first input area;
a second input electrode making direct contact with the second input area and receiving a control voltage to control a threshold voltage; and
an output electrode making direct contact with the output area.

10. The organic light emitting pixel of claim 9, wherein the control electrode of the first thin film transistor receives the gate voltage and the first input electrode of the first thin film transistor receives a data voltage corresponding to the pixel voltage.

11. The organic light emitting pixel of claim 9, wherein the first input electrode of the second thin film transistor receives a power source voltage to drive the organic light emitting diode.

12. The organic light emitting pixel of claim 11, wherein the organic light emitting diode comprises a first electrode, an organic light emission layer, and a second electrode, the first electrode receives a first voltage corresponding to the power source voltage, and the second electrode receives a second voltage lower than the first voltage.

13. The organic light emitting pixel of claim 9, wherein the doping concentration of the second input area is in a range from about $1/10$ to $1/500$ of the doping concentration of the first input area.

14. The organic light emitting pixel of claim 13, wherein the first input area, the second input area, and the output area are doped with the same type of dopant.

15. The organic light emitting pixel of claim 14, wherein the first input area, the second input area, and the output area are doped with a p-type dopant, the channel area is doped with an n-type dopant, the threshold voltage is increased when the control voltage is negative, and the threshold voltage is decreased when the control voltage is positive.

16. The organic light emitting pixel of claim 9, further comprising a first insulating layer formed between the control electrode and the semiconductor pattern.

17. The organic light emitting pixel of claim 16, further comprising a second insulating layer formed on the first insulating layer, wherein the control electrode is formed on the first insulating layer, the first insulating layer covers the semiconductor pattern, and wherein the first input electrode, the second input electrode, and the output electrode are formed on the second insulating layer, and the second insulating layer covers the control electrode.

18. The organic light emitting pixel of claim 17, wherein the first input electrode is connected to the first input area through a first contact hole formed through the first insulating layer and the second insulating layer, the second input electrode is connected to the second input area through a second contact hole formed through the first insulating layer and the second insulating layer, and the output electrode is connected to the output area through a third contact hole formed through the first insulating layer and the second insulating layer.

19. The organic light emitting pixel of claim 16, wherein the semiconductor pattern is formed on the first insulating layer, and the first insulating layer covers the control electrode.

* * * * *